United States Patent [19]

Miyamoto

[11] Patent Number: 5,394,366
[45] Date of Patent: Feb. 28, 1995

[54] ENABLING DATA ACCESS OF A UNIT OF ARBITRARY NUMBER OF BITS OF DATA IN A SEMICONDUCTOR MEMORY

[75] Inventor: Takayuki Miyamoto, Hyogo, Japan

[73] Assignee: Mitsubishi Denki Kabushiki Kaisha, Tokyo, Japan

[21] Appl. No.: 925,152

[22] Filed: Aug. 6, 1992

[30] Foreign Application Priority Data

Aug. 9, 1991 [JP] Japan .................. 3-200278

[51] Int. Cl.$^6$ .................................. G11C 7/00
[52] U.S. Cl. ........................... 365/195; 365/196; 365/193; 365/189.01; 365/189.03
[58] Field of Search ............ 365/195, 189.01, 196, 365/221, 189.02, 189.03, 189.12, 230.02, 230.09, 193; 364/514, 516

[56] References Cited

U.S. PATENT DOCUMENTS

| 4,669,064 | 5/1987 | Ishimoto | 365/195 |
| 4,897,818 | 1/1990 | Redwine et al. | 365/195 |
| 5,313,624 | 5/1994 | Harriman et al. | 395/575 |

OTHER PUBLICATIONS

"Home VTR Containing Field Memory for Correcting Crossbar and Skew Distortion in Search Mode", Nikkei Electronics, vol. 406, Oct. 20, 1986, pp. 195-214.

Primary Examiner—Eugene R. LaRoche
Assistant Examiner—Huan Hoang
Attorney, Agent, or Firm—Lowe, Price, LeBlanc & Becker

[57] ABSTRACT

A DRAM device includes a read control circuit for inhibiting read out of one or more bits of a multi-bit data output from a plurality of memory cells in response to a bit designating signal for specifying the one or more bits. By arbitrarily setting the number of bits to be output from the DRAM device and combining that output with data from one or more additional memory devices, data of an arbitrary number of bits can be generated at a high speed.

13 Claims, 17 Drawing Sheets

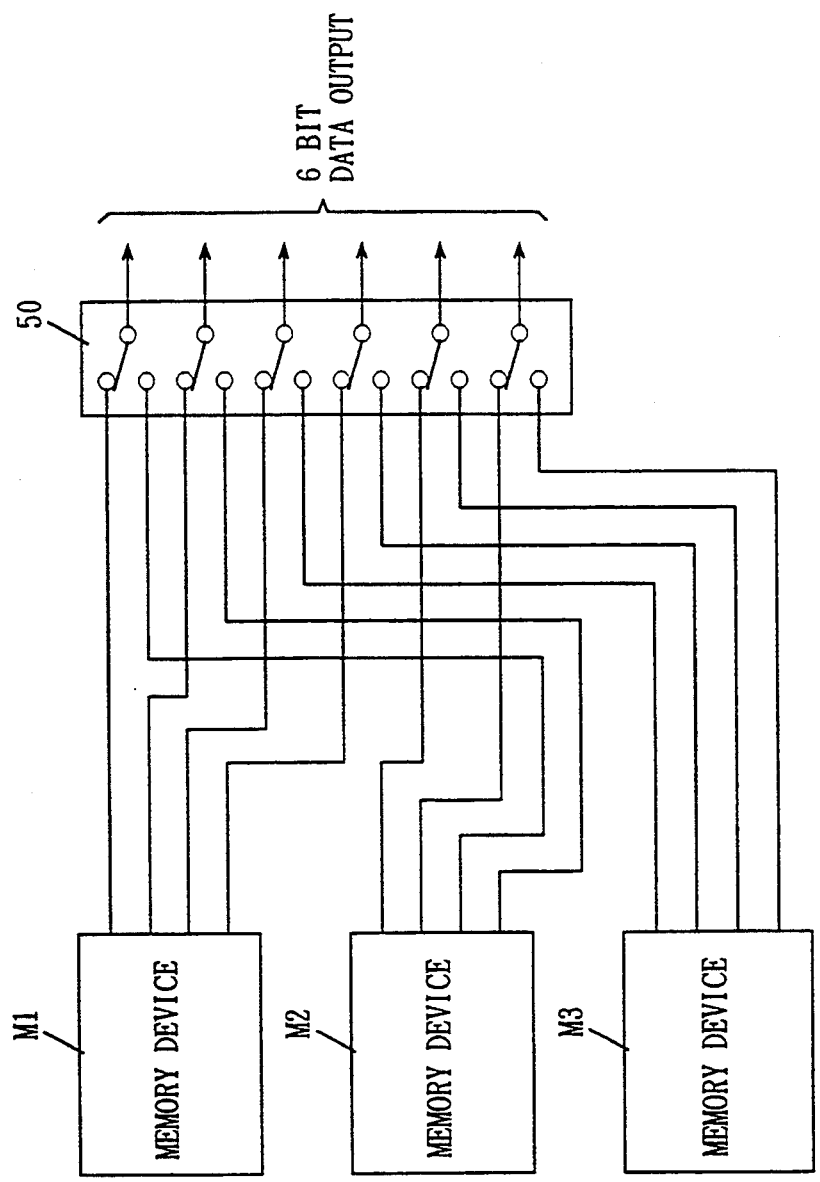

ENABLING DATA ACCESS OF A UNIT OF ARBITRARY NUMBER OF BITS OF DATA IN A SEMICONDUCTOR MEMORY

BACKGROUND OF THE INVENTION

1. Field of the Invention

The present invention relates generally to dynamic semiconductor memory devices having a multi-bit configuration as a unit and image data generation device for generating image data of a selected number of bits, and more particularly, to memory devices enabling selective read of a specified smaller number of bits out of a given larger plurality of bits.

2. Description of the Background Art

A conventional dynamic random access memory device (hereinafter referred to as DRAM) generates data by 1 bit, 4 bits or 8 bits. DRAM devices of ×4 bits and ×8 bits are generally called memory devices having a multi-bit configuration.

In the field of image processing, data is often used on an basis such as 6 bits or 7 bits. This is because of the following reason. That is, memories are originally used in computers to store 4-bit, 8-bit or 16-bit data. On the other hand, 6-bit or 7-bit data is used for image processing. While a 8-bit memory has a large memory capacity, it incurs more expensive manufacturing costs, and production of special 6-bit or 7-bit memories also costs much.

Such image data of 6-bit or 7-bit is used for forming such special images as those in a search mode and slow reproduction (see "Home VTR Containing Field Memory for Correcting Crossbar and Skew Distortion in Search Mode" NIKKEI ELECTRONICS, Oct. 20, 1986, Vol. 406).

FIG. 12A is a block diagram showing a device for generating 6-bit luminance data shown in the above-described article.

With reference to FIG. 12A the device includes ×4-bit memory devices M1, M2 and M3 and a selector 50 for selecting 6-bit data. Luminance data is written in each of memory devices M1–M3 by 4 bits. Selector 50 alternately selects either 4-bit data from memory device M1 and 2-bit data from memory device M3 or 2-bit data from memory device M3 and 4-bit data from memory device M2 for each field. 6-bit luminance data is generated at the output terminal of selector 50 in this way.

Selector 50, however, requires 6 switch circuits for selecting 6-bit data, which necessitates an increased number of elements.

The memory device in FIG. 12A is considered to have the structure as shown in FIGS. 12B to 12D.

FIG. 12B is a block diagram of a DRAM having 4-bit configuration. FIG. 12C is a timing chart of the DRAM device of FIG. 12B.

With reference to FIG. 12B, the DRAM device comprises an $\overline{RAS}$ terminal for receiving a row address strobe signal $\overline{RAS}$ (hereinafter referred to as an $\overline{RAS}$ signal), a $\overline{CAS}$ terminal for receiving a column address strobe signal $\overline{CAS}$ (hereinafter referred to as a $\overline{CAS}$ signal), Add terminals for receiving an address signal Add, an $\overline{OE}$ terminal for receiving an output enable signal $\overline{OE}$, data input/output terminals DQ1–DQ4 and a $\overline{WE}$ terminal for receiving a write control signal $\overline{WE}$. Data input/output terminals DQ1–DQ4 receive input/output data.

The DRAM device further includes a memory cell array 1, a row decoder 2, a column decoder 3, an address buffer 4, an RAS buffer 5, a CAS buffer 6, an output buffer 7, an input buffer 8, a $\overline{OE}$ buffer circuit 90 and a $\overline{WE}$ buffer circuit 100.

Memory cell array 1 is divided into four memory cell array blocks 1a, 1b, 1c and 1d. A plurality of memory cells MC arranged in a matrix, word lines WL arranged in a row direction and bit lines BL arranged in a column direction are provided in each of memory cell array blocks 1a–1d. Row decoder 2 decodes a row address signal of an address signal applied in a time divisional manner to select one word line WL of each of memory cell array blocks 1a–1d. Column decoder 3 decodes a column address signal of an address signal applied in a time divisional manner to select one (a pair of bit lines) bit line BL of each of memory cell array blocks 1a–1d. As a result, a memory cell at the word line and the bit line selected by row decoder 2 and column decoder 3 is simultaneously designated in each of memory cell array blocks 1a–1d.

Address buffer 4 receives address signal Add to generate an internal address signal. The internal address signal is applied to row decoder 2 and column decoder 3.

RAS buffer 5 receives row address strobe signal $\overline{RAS}$ to generate an internal $\overline{RAS}$ signal. The internal $\overline{RAS}$ signal is applied to row decoder 2 and $\overline{OE}$ buffer circuit 90.

CAS buffer 6 receives $\overline{CAS}$ signal to generate an internal $\overline{CAS}$ signal. The internal $\overline{CAS}$ signal is applied to column decoder 3.

$\overline{OE}$ buffer circuit 90 is coupled to output buffer 7 in a differential manner and connected to $\overline{OE}$ terminal data. $\overline{OE}$ buffer circuit 90 activates output buffer 7 in response to $\overline{OE}$ signal.

$\overline{WE}$ buffer circuit 100 is coupled to input buffer 8 in a differential manner and connected to $\overline{WE}$ terminal. $\overline{WE}$ buffer circuit 100 activates input buffer 8 in response to write enable signal $\overline{WE}$.

Output buffer 7 receives data from memory cells of 4 bits and applies the received data to data input/output terminals DQ1–DQ4.

Input buffer 8 receives the 4-bit data from data input/output terminals DQ1–DQ4 and applies the same to designated memory cells of 4 bits.

FIG. 12C is a timing chart illustrating an operation of the DRAM device of FIG. 12B. The hatched portions of the drawing are in an arbitrary state.

A row address signal included in an address signal Add is strobed at a fall of $\overline{RAS}$ signal and a column address signal is strobed at a fall of $\overline{CAS}$ signal. A row address and a column address designate a memory cell in the memory cell array. The data from the input/output terminal DQ1–DQ4 is written at the designated memory cells, and the written data is read out from the memory cells.

FIG. 12D is a block diagram showing the output buffer of FIG. 12B. With reference to the figure, output buffer 7 includes data output buffers 71, 72, 73 and 74.

Each of data output buffers 71–74 is connected between the corresponding data input/output terminal DQ1–DQ4 and an I/O terminal of memory cell array 1 and enters a read allowed state or a read inhibited state (high impedance state) in response to the $\overline{OE}$ signal.

A common DRAM having a multi-bit configuration includes an output enable terminal, to which terminal an output enable signal $\overline{OE}$ (hereinafter referred to as $\overline{OE}$ signal) is applied, thereby simplifying the structure of the image data generation device.

FIG. 13 is a block diagram showing an image data generation device using an $\overline{OE}$ signal. With reference to FIG. 13, the image data generation device includes data input/output terminals DQ1, DQ2, DQ3 and DQ4, memory devices M1, M2, and M3 of ×4-bit configuration, a timing generator 51 and a selector 52.

Timing generator 51 generates output enable signals $\overline{OE1}$ and $\overline{OE2}$ and a selection signal $\overline{\phi}$ in response to a clock signal $\phi$. $\overline{OE1}$ signal and $\overline{OE2}$ signal are applied to memory devices M1 and M2, respectively, and $\overline{\phi}$ signal is applied to selector 52.

Memory device M1 comprises output ports 1a, 1b, 1c and 1d, memory device M2 comprises output ports 2a, 2b, 2c and 2d and memory device M3 comprises output ports 3a, 3b, 3c and 3d. Output ports 1a–1d and 2a–2d are connected to data output terminals DQ1–DQ4, while output ports 3a–3d are connected to input terminals of selector 52. Selector 52 includes 2-input 1-output switch circuits 52a and 52b. Switch circuit 52a has input terminals connected to output ports 3a and 3b and an output terminal connected to a data input/output terminal DQ5. Switch circuit 52b has input terminals connected to output ports 3c and 3d and an output terminal connected to a data input/output terminal DQ6.

FIG. 14 is a timing chart of the image data generation device of FIG. 13. Memory device M1 outputs data when $\overline{OE1}$ signal is at a low level, while memory device M2 outputs data when $\overline{OE2}$ signal is at a low level. Memory device M3 outputs data at any time because $\overline{OE}$ signal is fixed to a ground level. Selector 52 selects output ports 3a and 3c when $\Phi$ signal is at a low level and selects output ports 3b and 3d when $\Phi$ signal is at a high level. Data input/output terminals DQ1–DQ4 alternately receive 4-bit data from memory device M1 and 4-bit data from memory device M2, while data output terminals DQ5 and DQ6 alternately receive 2-bit data (3a–3c) and (3b, 3d) out of 4-bit data generated from memory device M3. Data input/output terminals DQ1–DQ6 obtain 6-bit data in this way.

Extremely high speed data processing is desirable in the field of the image processing.

However, an image data generation device should include selectors provided outside memory devices as shown in FIGS. 12A and 13 such that data read from the memory devices is output through interconnections and the selectors. Data transmission speed is reduced as a result. In addition, four data lines of each memory device are connected to inputs of each selector, making the interconnections complicated.

The present invention is directed to selectively inhibiting the memory device of FIGS. 13 and 14 from outputting a specified bit in order to avoid the necessity of a selector.

Such a memory device has not yet been producted.

SUMMARY OF THE INVENTION

An object of the present invention is to selectively inhibit read of a desired bit in a memory device having a multi-bit configuration.

Another object of the present invention is to enable high speed data processing in an image data generation device.

A further object of the present invention is to generate image data of an arbitrary number of bits in an image data generation apparatus, wherein an arbitrary number is different from the number of bits of each of memory devices used.

Briefly stated, according to one aspect of the present invention, a dynamic semiconductor memory device includes a memory cell array having a plurality of memory cells each storing 1-bit data, an operation mode designating signal receiver, a bit designating signal receiver and a read controller.

The operation mode designating signal receiver receives an external signal for designating an operation mode wherein read of a desired bit, out of a plurality of bits, is inhibited.

The bit designating signal receiver receives an external bit designating signal for designating a bit the read of which is to be inhibited, in response to the operation mode designating signal received by the operation mode designating signal receiver.

The read controller selectively inhibits read of desired bit data based on an externally generated read control signal and the bit designating signal received by the bit designating signal receiver.

In accordance with another aspect of the present invention, the dynamic semiconductor memory device further includes a write controller. The write controller selectively inhibits write of specified bit data, from among the data of a plurality of bits, based on externally generated write control signal and bit designating signal.

According to a further aspect of the present invention, an image data generation apparatus includes a plurality of dynamic semiconductor memory devices according to one aspect of the present invention and a signal generation device. The signal generation device generates a signal for setting each dynamic semiconductor memory device to operate in a write state, a signal for enabling the same to operate in a read state, a signal for designating an operation mode for inhibiting read of a specified bit out of the plurality of bits and a signal for designating a bit the read of which is to be inhibited out of the plurality of bits.

According to a still further aspect of the present invention, an image data generation device includes a plurality of dynamic semiconductor memory devices in accordance with another aspect of the present invention and a signal generation device.

In the device in accordance with one aspect of the present invention, the operation mode designating signal receiver receives an external operation mode designating signal. In response to the received operation mode designating signal, the bit designating signal receiver receives an external signal for designating a bit the read of which is to be inhibited out of a plurality of bits. The received bit designating signal is applied to the read controller which selectively inhibits an output of a specified bit in response to the applied bit designating signal. As a result, the number of bits can be reduced, thereby enabling data generation of a desired number of bits among the plurality of bits.

Since in the device according to another aspect of the invention a bit, is designated, and as a result, the write to the designated bit out of input data can be inhibited. As a result, the number of bits of input/output data can be reduced and write to and read from data of a desired number of bits can be performed among the larger plurality of bits of memory storage.

The device according to a still further aspect of the invention wherein read of at least one memory device is inhibited, enables generation of image data of a desired number of bits within the total number of bits of the plurality of dynamic semiconductor memory devices. It is therefore unnecessary to use a selector for selecting data read from a semiconductor memory device as is necessary in conventional art, enabling data reading at a high speed accordingly.

The device according to a still further aspect of the invention wherein a bit write to/read of which is to be inhibited is designated for at least one semiconductor memory device, enables generation of image data of a desired number of bits within the total number of bits of the plurality of semiconductor memory devices. With no selector used, high speed access is possible.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12A is a block diagram of a conventional image data generation device.

DESCRIPTION OF THE PREFERRED EMBODIMENTS

Figure 1:
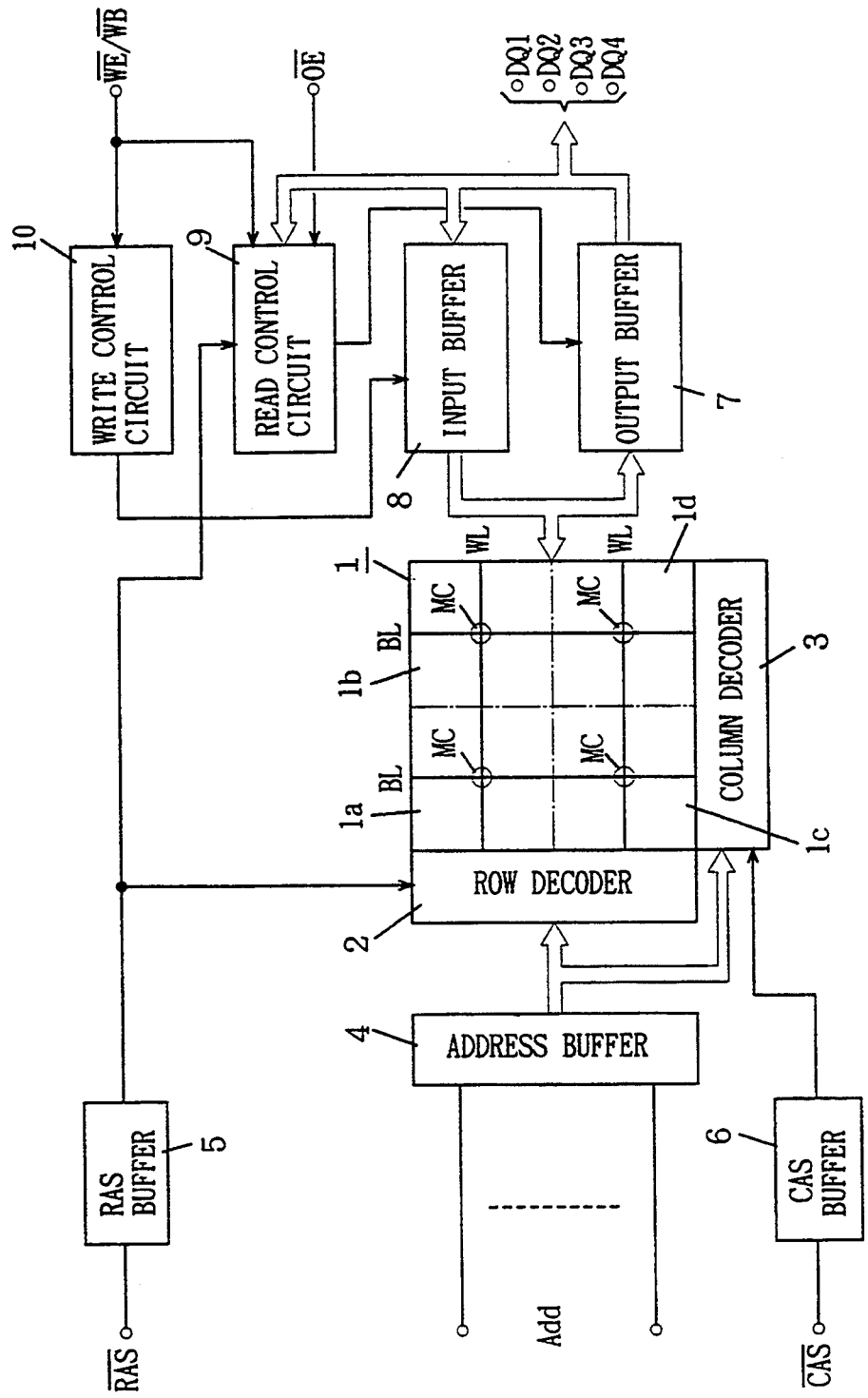
FIG. 1 is a block diagram of a DRAM device according to one embodiment of the present invention.
Figure 2:
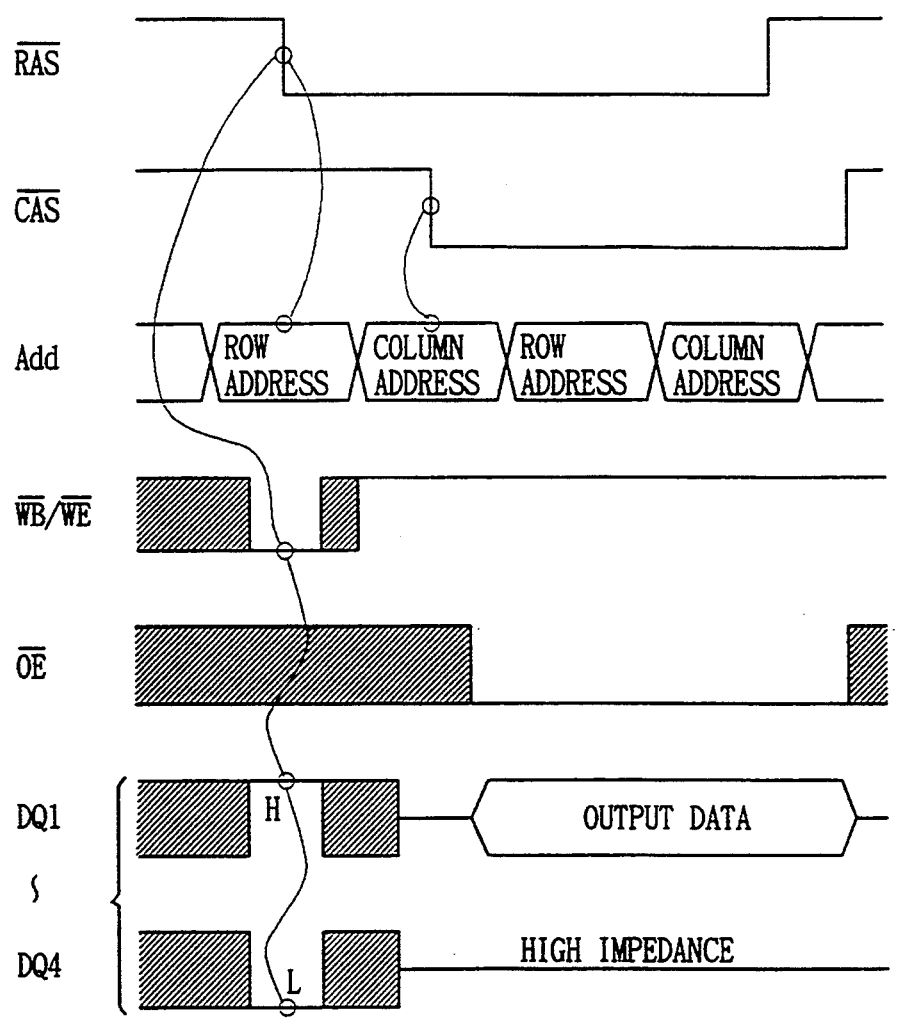
FIG. 2 is a timing chart of the DRAM device of FIG. 1.

FIG. 1 a block diagram of a DRAM device according to one embodiment of the present invention. FIG. 2 is a timing chart of the DRAM device.

With reference to FIG. 1, the DRAM device comprises an $\overline{RAS}$ terminal for receiving a row address strobe signal $\overline{RAS}$ (hereinafter referred to as an $\overline{RAS}$ signal), a $\overline{CAS}$ terminal for receiving a column address strobe signal $\overline{CAS}$ (hereinafter referred to as a $\overline{CAS}$ signal), Add terminals for receiving an address signal Add, an $\overline{OE}$ terminal for receiving an output enable signal $\overline{OE}$, data input/output terminals DQ1–DQ4 and a $\overline{WE}/\overline{WB}$ terminal for receiving a write control signal $\overline{WE}$ and an operation mode designating signal $\overline{WB}$ in a time divisional manner. Data input/output terminals DQ1–DQ4 receive a bit designating signal for designating a bit the read of which is to be inhibited and input/output data in a time divisional manner. Operation mode designating signal $\overline{WB}$ inhibits read of a desired bit out of 4-bit data.

The DRAM device further includes a memory cell array 1, a row decoder 2, a column decoder 3, an address buffer 4, an RAS buffer 5, a CAS buffer 6, an output buffer 7, an input buffer 8, a read control circuit 9 and a write control circuit 10.

Memory cell array 1 is divided into four memory cell array blocks 1a, 1b, 1c and 1d. A plurality of memory cells MC arranged in a matrix, word lines WL arranged in a row direction and bit lines BL arranged in a column direction are provided in each of memory cell array blocks 1a–1d. Row decoder 2 decodes a row address signal of an address signal applied in a time divisional manner to select one word line WL of each of memory cell array blocks 1a–1d. Column decoder 3 decodes a column address signal of an address signal applied in a time divisional manner to select one (a pair of bit lines) bit line BL of each of memory cell array blocks 1a–1d. As a result, a memory cell at the word line and the bit line selected by row decoder 2 and column decoder 3 is simultaneously designated in each of memory cell array blocks 1a–1d.

Address buffer 4 receives address signal Add to generate an internal address signal. The internal address signal is applied to row decoder 2 and column decoder 3.

RAS buffer 5 receives row address strobe signal $\overline{RAS}$ to generate an internal $\overline{RAS}$ signal. The internal $\overline{RAS}$ signal is applied to row decoder 2 and read control circuit 9.

CAS buffer 6 receives $\overline{CAS}$ signal to generate an internal $\overline{CAS}$ signal. The internal $\overline{CAS}$ signal is applied to column decoder 3.

Read control circuit 9 is operably coupled to output buffer 7 and connected to $\overline{WE}/\overline{WB}$ terminal, $\overline{OE}$ terminal and data input/output terminals DQ1–DQ4. Read control circuit 9 determines an existence of operation mode designating signal $\overline{WB}$ at a falling edge of internal $\overline{RAS}$ signal. When the circuit determines the existence of operation mode designating signal $\overline{WB}$, it inhibits read of only the designated bit among 4-bit data in response to a bit designating signal applied to data input/output terminals DQ1–DQ4.

Write control circuit 10 is operably coupled to input buffer 8 and connected to the $\overline{WE}/\overline{WB}$ terminal. Write control circuit 10 activates input buffer 8 in response to write enable signal $\overline{WE}$.

Output buffer 7 receives data from memory cells of 4 bits and applies the received data to data input/output terminals DQ1–DQ4.

Input buffer 8 receives the 4-bit data from data input/output terminals DQ1–DQ4 and applies the same to designated memory cells of 4 bits.

FIG. 2 is a timing chart illustrating an operation of the DRAM device of FIG. 1. The hatched portions of the drawing are in an arbitrary state.

A row address signal included in an address signal Add is strobed at a fall of $\overline{RAS}$ signal and a column address signal is strobed at a fall of $\overline{CAS}$ signal. A row address and a column address designate a memory cell in the memory cell array.

An operation mode designating signal $\overline{WB}$ is strobed at a fall of $\overline{RAS}$ signal. The strobed $\overline{WB}$ signal being at a low level is regarded as the designation of the above-described operation mode. When a bit designating signal to be applied to each of data input/output terminals DQ1-DQ4 at that time is at a low level, read of the bit is allowed, while when the signal is at a high level, read of the bit is inhibited.

Figure 3:
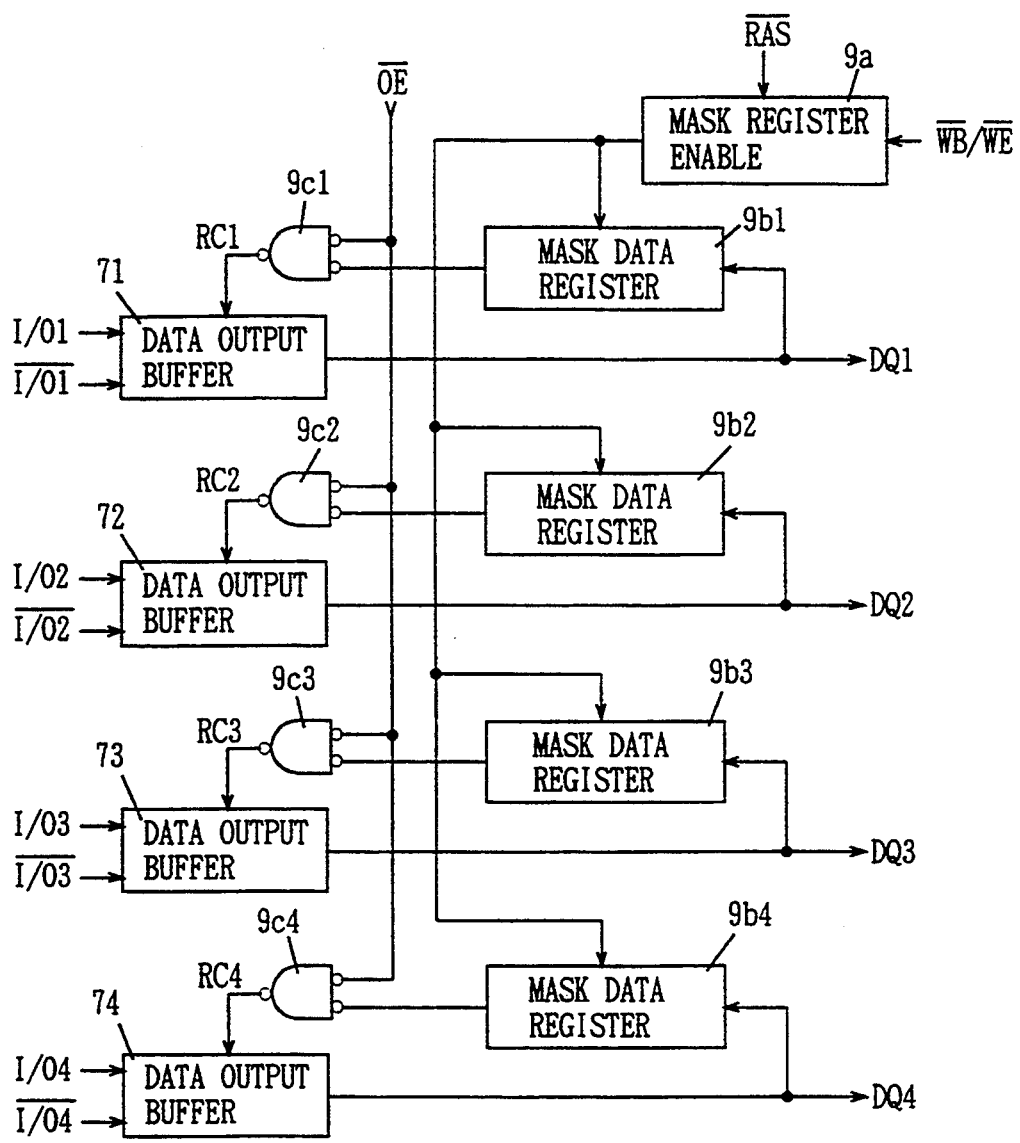
FIG. 3 is a block diagram of a read control circuit and an output buffer of FIG. 1.

FIG. 3 is a block diagram showing the read control circuit 9 and the output buffer 7 of FIG. 1. With reference to FIG. 3, read control circuit 9 includes a mask enable signal generation circuit 9a, mask data registers 9b1, 9b2, 9b3 and 9b4 and OR gates 9c1, 9c2, 9c3 and 9c4. Output buffer 7 includes data output buffers 71, 72, 73 and 74. j is given to a corresponding bit number in the following description.

Mask enable signal generation circuit 9a determines an existence of an operation mode designating signal $\overline{WB}$ at a fall of an internal $\overline{RAS}$ signal. When the circuit determines the existence of operation mode designating signal $\overline{WB}$, the circuit 9a generates a mask enable signal for activating mask registers 9b1-9b4. Each of mask data registers 9b1-9b4 is connected to the corresponding bit data input/output terminal DQj to hold a bit designating signal applied to the corresponding data input/output terminal DGj in response to the mask enable signal. Each of OR gates 9c1-9c4 has two input terminals and one output terminal, one input terminal being connected to receive $\overline{OE}$ signal and the other input terminal being connected to receive a bit designating signal held by the corresponding mask data register 9bj. The respective OR gates 9c1-9c4 generate read control signals RC1, RC2, RC3 and RC4 for controlling read of each bit in response to the bit designating signal held by the corresponding bit mask register 9bj and $\overline{OE}$ signal. When the read control signal is at a low level, read is allowed, while when the read control signal is at a high level, read is inhibited.

Each of data output buffers 71-74 is connected between the corresponding data input/output terminal DQj and an I/O terminal of memory cell array 1 and enters a read allowed state or a read inhibited state (high impedance state) in response to the read control signal from the corresponding OR gate 9cj.

Operation of read control circuit 9 of FIG. 3 will be described. An operation mode designating signal $\overline{WB}$ is strobed at a fall of $\overline{RAS}$ signal. When the strobed $\overline{WB}$ signal is at a low level, mask enable signal generation circuit 9a generates a mask enable signal which activates all of mask data registers 9b1-9b4. Each of mask data registers 9b1-9b4 holds a bit designating signal applied to the corresponding data input/output terminal DQj. The held bit designating signal is applied to the corresponding OR gate 9cj. Each of OR gates 9c1-9c4 generates a read control signal RCj in response to a bit designating signal held by the corresponding mask data register 9bj. When read control signal RCj is at a low level, data output buffer 7j enters a read allowed state to output the corresponding one bit out of 4 bits. When read control signal RCj is at a high level, data output buffer 7j enters a read inhibited state (high impedance state).

Figure 4:
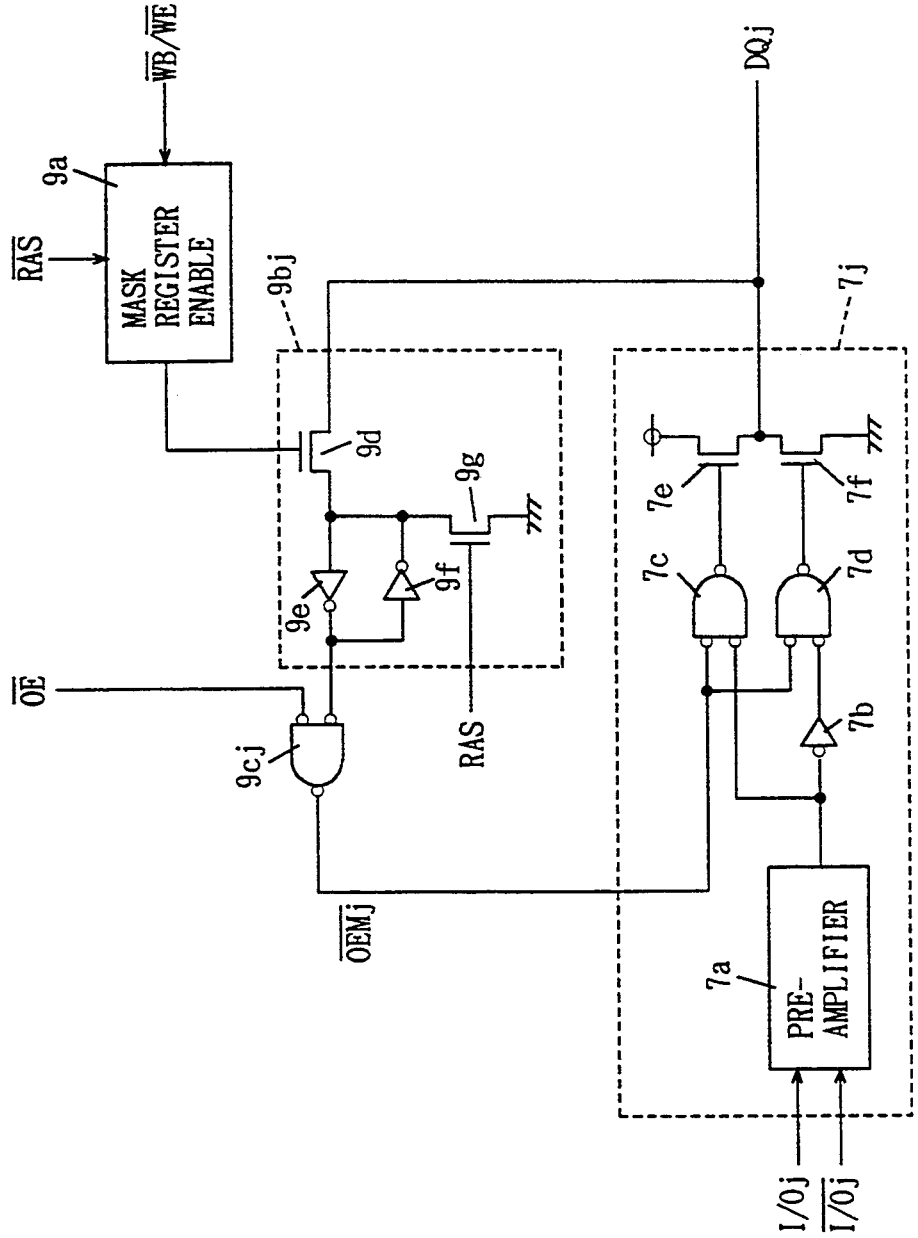
FIG. 4 is a circuit diagram showing the details equivalent to one bit of FIG. 3.

FIG. 4 is a circuit diagram showing the details equivalent to one bit of FIG. 3. With reference to FIG. 4, mask data register 9bj includes an NMOS transistor 9d, an inverter 9e, an inverter 9f and an NMOS transistor 9g. NMOS transistor 9d passes a bit designating signal from data input/output terminal DQj in response to a mask enable signal generated from mask enable signal generating circuit 9a. Inverters 9e and 9f constitute a latch circuit. NMOS transistor 9g activates the latch circuit in response to $\overline{RAS}$ signal. In an active state, the latch circuit holds a bit designating signal applied through NMOS transistor 9d and applies the same to OR gate 9cj. OR gate 9cj generates a control signal for inhibiting read when the applied bit designating signal is at a high level and generates a control signal for allowing read only when the applied bit designating signal is at a low level and $\overline{OE}$ signal is at a low level.

A data output buffer 7j includes a preamplifier 7a, an inverter 7b, an NOR gate 7c, an NOR gate 7d, an NMOS transistor 7e and an NMOS transistor 7f. Preamplifier 7a amplifies one-bit data from a memory cell. NOR gates 7c and 7d each has two input terminals and one output terminal. NOR gate 7c has one input terminal connected to the output of OR gate 9cj, the other input terminal connected to receive one-bit data amplified by the preamplifier and an output terminal connected to a gate electrode of NMOS transistor 7e. NOR gate 7d has one input terminal connected to the output of OR gate 9cj, the other input terminal connected to receive one-bit data inverted by inverter 7b and an output terminal connected to the gate electrode of NMOS transistor 7f. Each of NMOS transistors 7e and 7f has a gate electrode, a drain electrode and a source electrode. The drain electrode of NMOS transistor 7e is connected to a power source voltage and the source electrode is connected to the drain electrode of NMOS transistor 7f and data input/output terminal DQj. The source electrode of NMOS transistor 7f is connected to a ground potential.

In data output buffer 7j structured as described above, both of NOR gates 7c and 7d output a low level signal when read control signal RCj is at a high level. NMOS transistors 7e and 7f both turn on as a result (a high impedance state). When read control signal RCj is at a low level, output states of NOR gates 7c and 7d are determined based on the level of one-bit data from preamplifier 7a or inverter 7b.

As described above, since the DRAM device shown in FIGS. 1-4 allows designation of bits the read of which is allowed and bits the read of which is inhibited upon application of a bit designating signal to a data input/output terminal, a combined use of those DRAM devices enables generation of data of a desired number of bits.

Figure 5:
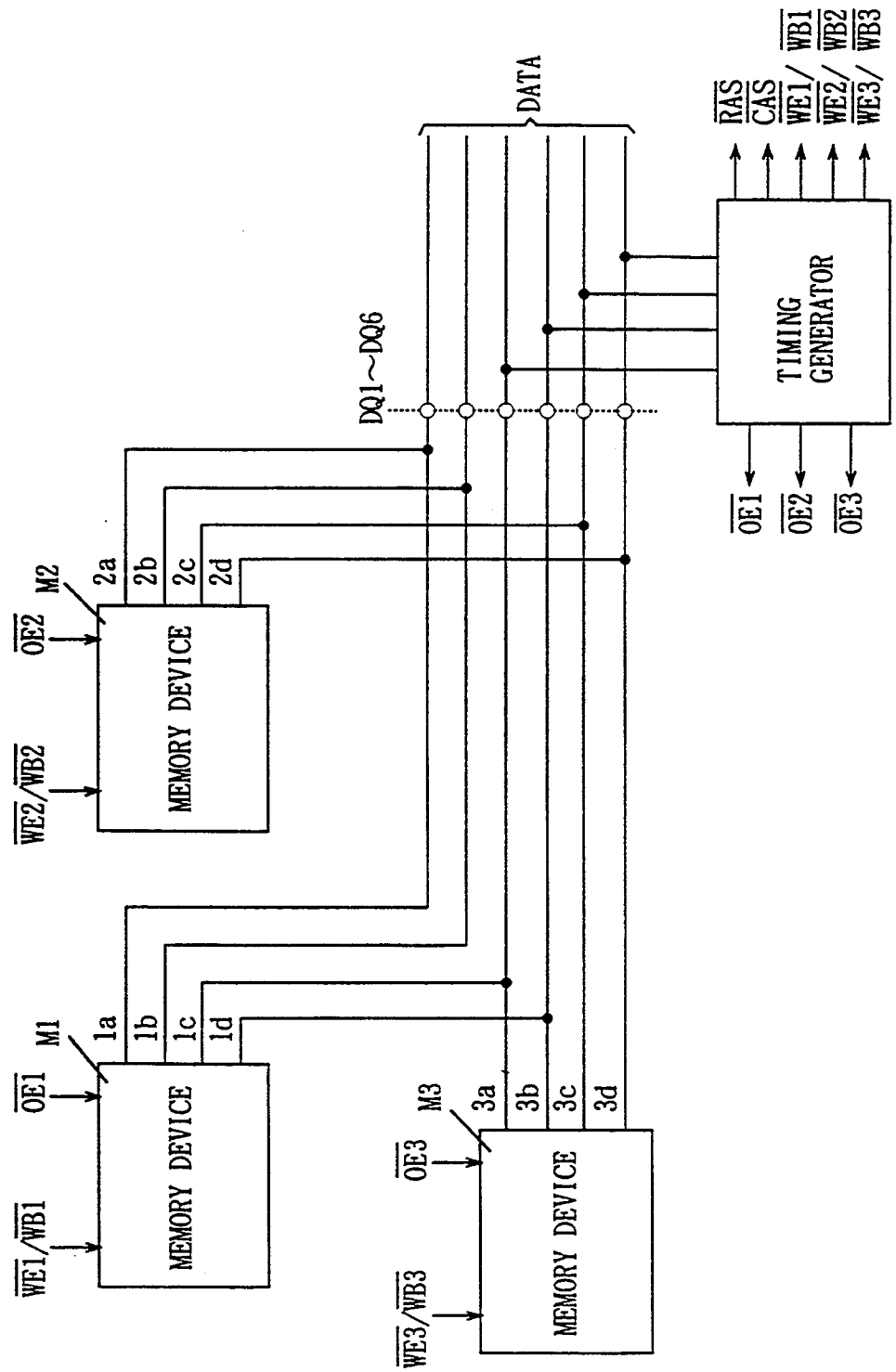
FIG. 5 is a block diagram of an image data generation device for generating image data of an arbitrary number of bits.
Figure 13:
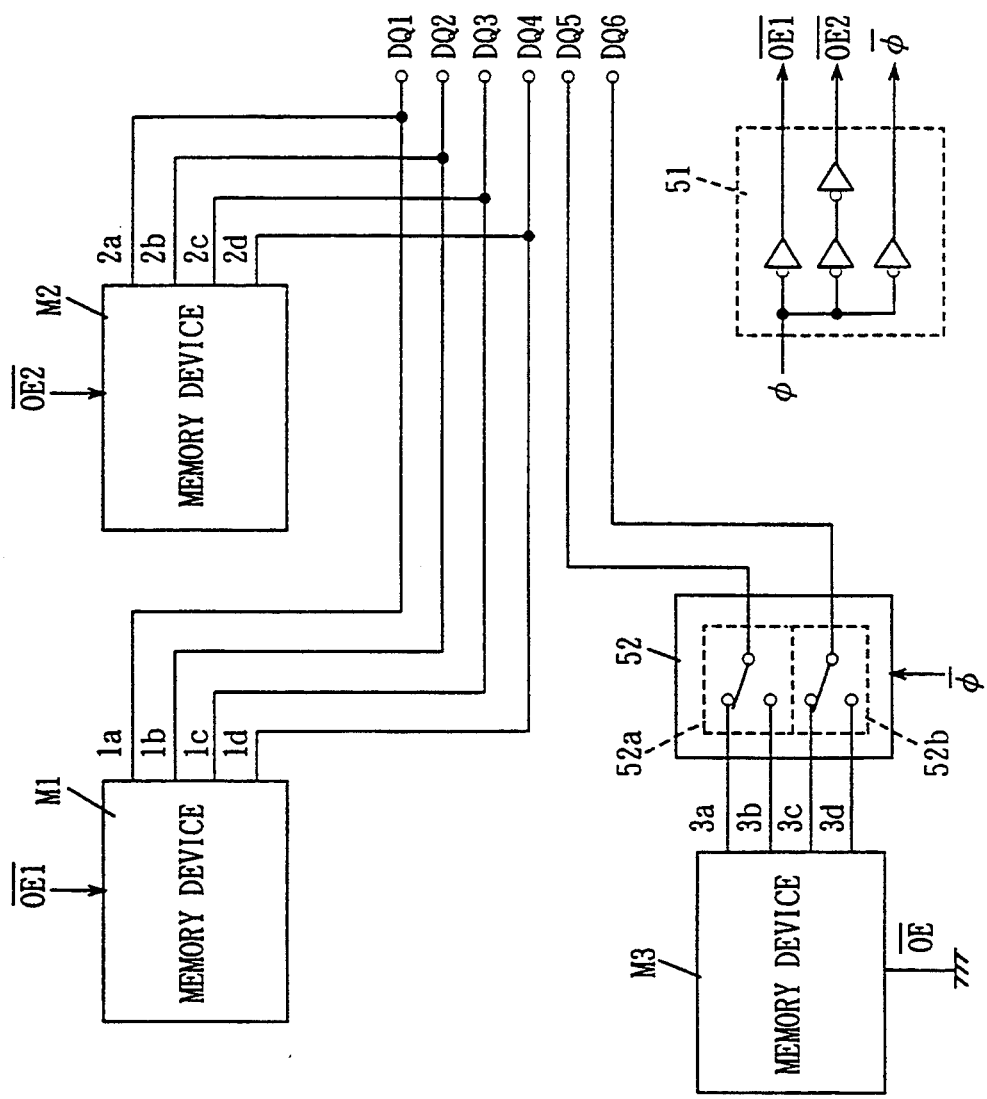
FIG. 13 is a block diagram of a conventional data generation device.
Figure 14:
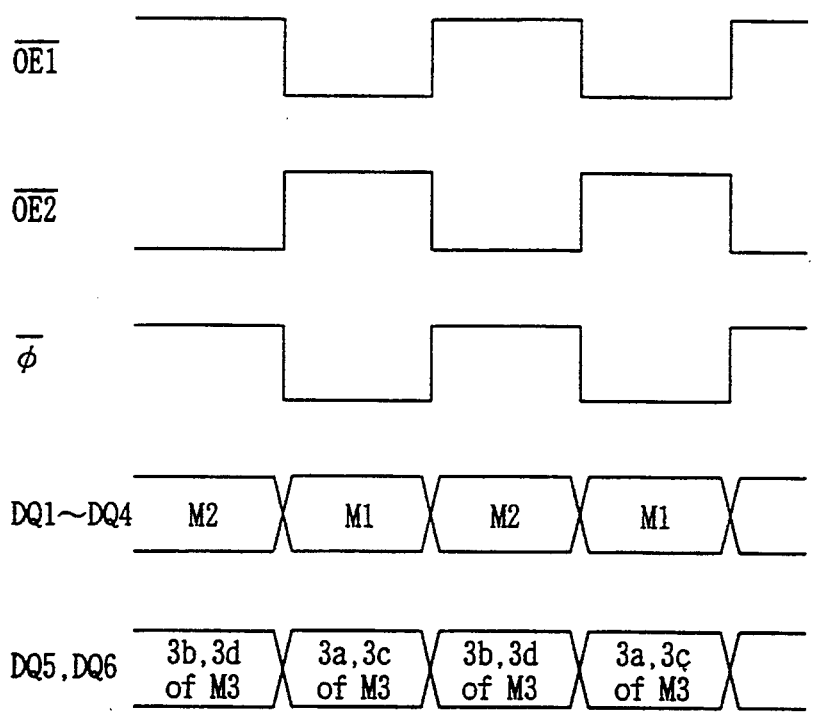
FIG. 14 is a timing chart of the image data generation device of FIG. 13.

FIG. 5 is a block diagram showing an image generation device implemented with those DRAM devices of the invention for generating image data of an arbitrary number of bits. With reference to FIG. 5 and FIG. 13, the image data generation device of FIG. 5 differs from that of FIG. 13 in that memory devices M1-M3 shown in FIGS. 1 to 4 replace ordinary DRAMs and a timing generator 11 replaces the selector 52.

Timing generator 11 generates an $\overline{RAS}$ signal, a $\overline{CAS}$ signal, an $\overline{OE1}$ signal, $\overline{OE2}$ and $\overline{OE3}$ signals, and a $\overline{WE1}/\overline{WB1}$ signal, a $\overline{WE2}/\overline{WB2}$ signal and a $\overline{WE3}/\overline{WB3}$ signal which are obtained by processing write control signal and an operation mode designating signal in a time divisional manner. $\overline{OE1}$ and $\overline{WE1}/\overline{WB1}$ signals are applied to memory device M1, $\overline{OE2}$ signal and $\overline{WE2}/\overline{WB2}$ signal are applied to memory device M2, and $\overline{OE3}$ signal and $\overline{WE3}/\overline{WB3}$ signal are applied to memory device M3. The bit designating signal is applied to data input/output terminals DQ3–DQ6.

Memory devices M1–M3 allow data thereof to be read and a bit of a low level to be masked in response to a bit designating signal when operation mode designating signals $\overline{WB1}$–$\overline{WB3}$ and $\overline{OE1}$–$\overline{OE3}$ signals are received. The image data generation device designates a bit the read of which is to be inhibited only for memory device M3.

Figure 6:
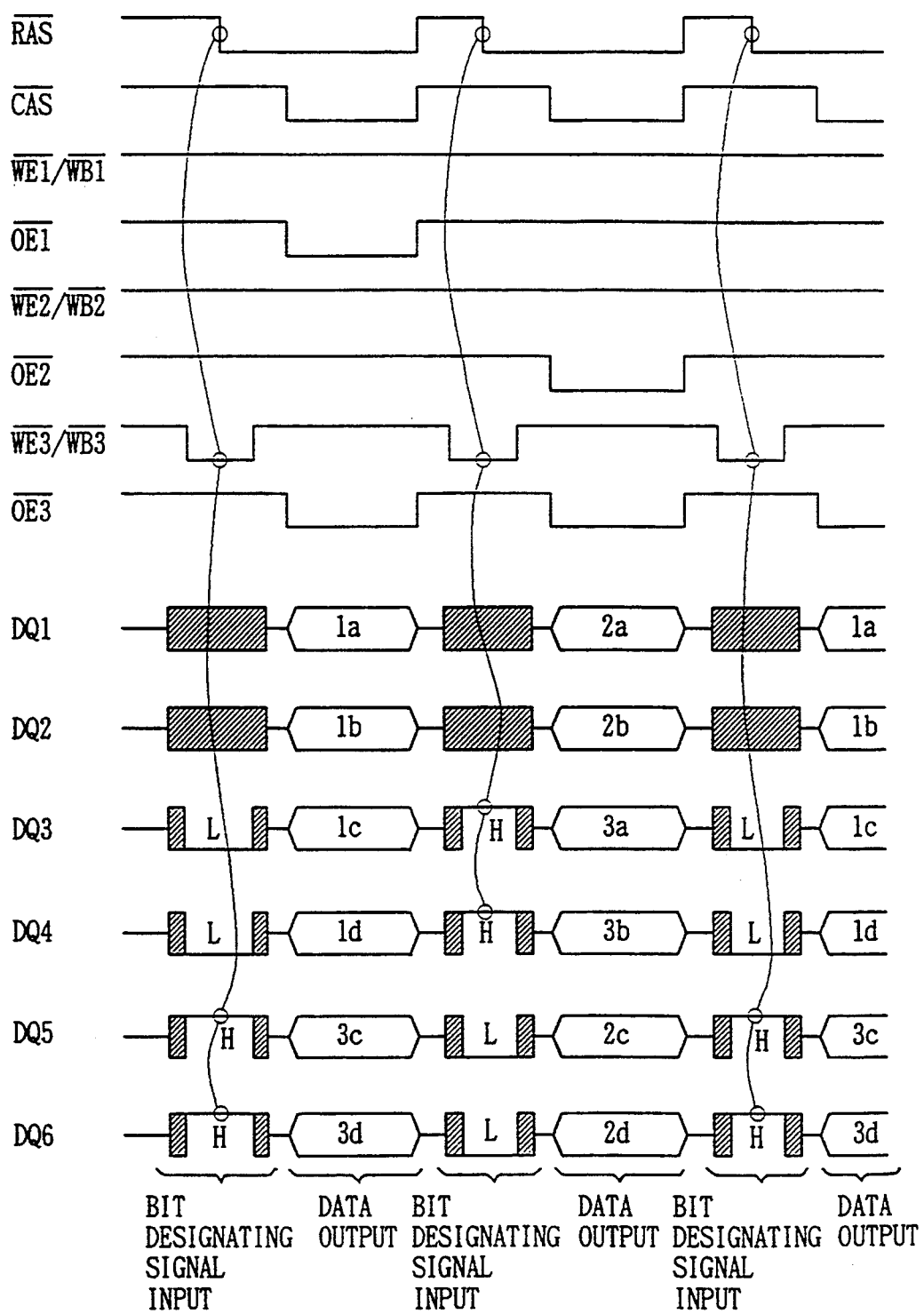
FIG. 6 is a timing chart of the image data generation device of FIG. 5.

FIG. 6 is a timing chart of image data generation device of FIG. 5. With reference to FIG. 6, with operation mode designating signals $\overline{WB1}$ and $\overline{WB2}$ being fixed to a high level at all times, memory devices M1 and M2 read 4-bit data when $\overline{OE1}$ and $\overline{OE2}$ signals are active. Operation mode designating signal $\overline{WB3}$ is brought down to a low level at a fall of $\overline{RAS}$, while $\overline{OE3}$ is set to have the same cycle as that of $\overline{CAS}$ signal. Data input/output terminals DQ3 and DQ4 and data input/output terminals DQ5 and DQ6 alternately receive a low level bit designating signal.

An operation of the image data generation device shown in FIGS. 5 and 6 will be described. Operation mode designating signals $\overline{WB1}$–$\overline{WB3}$ and bit designating signals applied to data input/output terminals DQ1–DQ6 are strobed at a fall of $\overline{RAS}$ signal. When operation mode designating signal $\overline{WB3}$ is at a low level, memory device M3 captures the low level bit designating signal applied to data input/output terminals DQ3 and DQ4 in mask data registers 9$b$1 and 9$b$2 (see FIG. 3) and captures a high level bit designating signal applied to data input/output terminals DQ5 and DQ6 in mask registers 9$b$3 and 9$b$4. As a result, outputs 3$a$ and 3$b$ of memory device M3 are masked. Then $\overline{CAS}$ signal, $\overline{OE1}$ signal and $\overline{OE3}$ signal are brought down to a low level, whereby data 1$a$–1$d$ are read from memory device M1, while data 3$c$ and 3$d$ are read from memory device M3. As a result, 6-bit data including 1$a$–1$d$ and 3$c$–3$d$ are obtained at data input/output terminals DQ1–DQ6. Then at a subsequent fall of $\overline{RAS}$ signal, operation mode designating signal $\overline{WB3}$ and bit designating signals applied to data input/output terminals DQ3–DQ6 are strobed. In this cycle, the bit designating signals applied to data input/output terminals DQ3 and DQ4 are at a high level, while the bit designating signals applied to data input/output terminals DQ5 and DQ6 are at a low level, whereby data 3$c$ and 3$d$ of memory device M3 are masked to allow output of 3$a$ and 3$b$ data of memory device M3. As a result, 4-bit data 2$a$–2$b$ and 2-bit data 3$c$ and 3$d$ are output from memory devices M2 and M3, respectively, in response to subsequent $\overline{OE2}$ and $\overline{OE3}$ signals.

As described in the foregoing, application of a bit designating signal to data input/output terminals DQ3 to DQ6 inhibits read of a specified bit, out of 4 bits of each of memory devices M1–M3. It is therefore possible to generate image data of an arbitrary number of bits.

Figure 7:
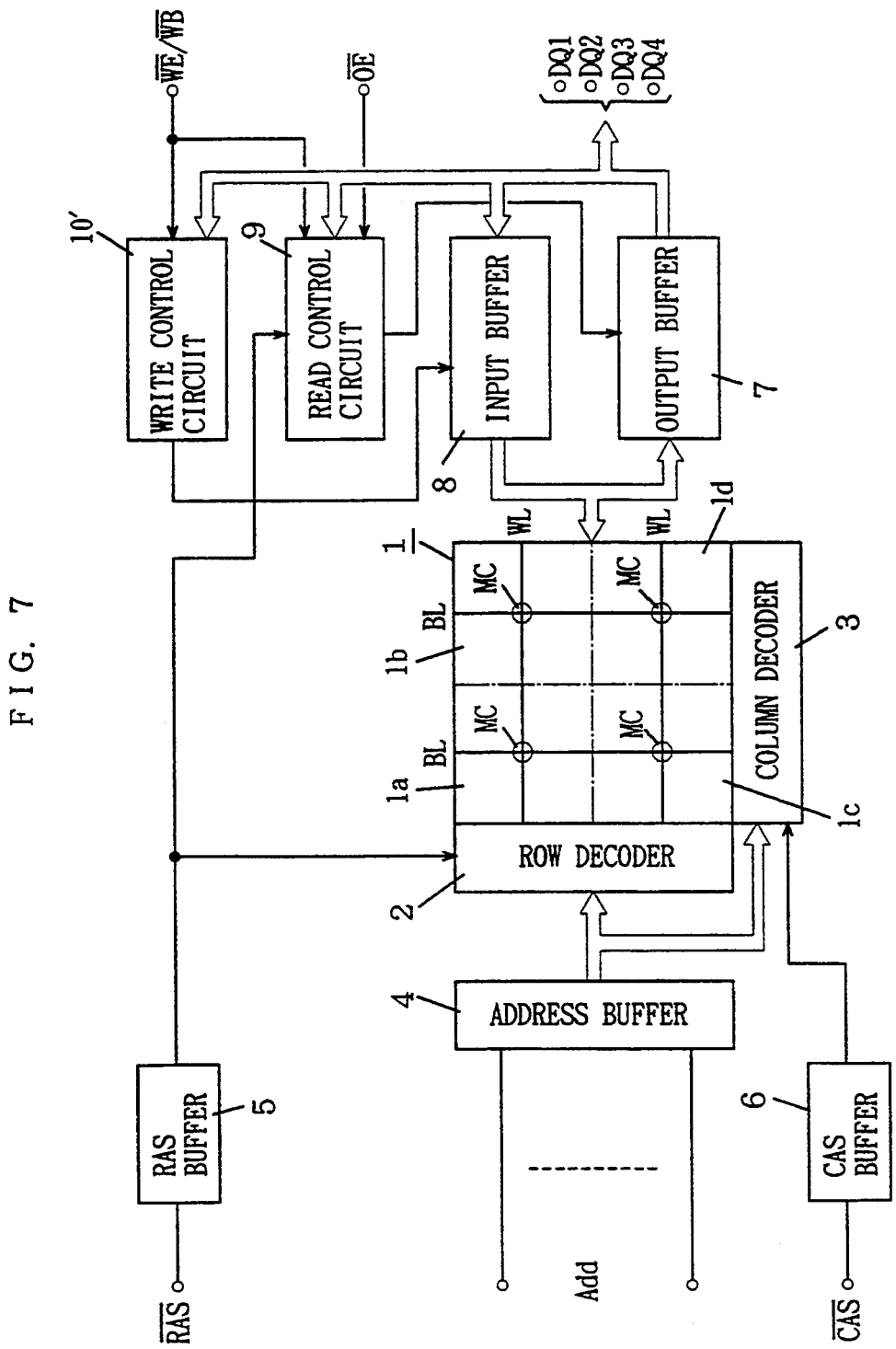
FIG. 7 is a block diagram showing a DRAM device according to another embodiment.

FIG. 7 is a block diagram showing another embodiment of a DRAM device. With reference to the FIG. 7 and FIG. 1, the DRAM device of FIG. 7 differs from that of FIG. 1 in that a write control circuit 10' allowing inhibition of write of only a desired bit, out of four bits, replaces the write control circuit for writing 4-bit data and in that a signal for designating such an operation mode is applied to $\overline{WE/WB}$ terminal.

Write control circuit 10' is operably connected to input buffer 8 and to $\overline{WE/WB}$ terminal and data input/output terminals DQ1–DQ4. Write control circuit 10' determines whether a $\overline{WB}$ signal exists or not in response to an internal $\overline{RAS}$ signal. When determining that $\overline{WB}$ signal exists, the circuit inhibits write of only a designated bit, out of 4-bit data, in response to a bit designating signal applied to data input/output terminals DQ1–DQ4.

Figure 8:
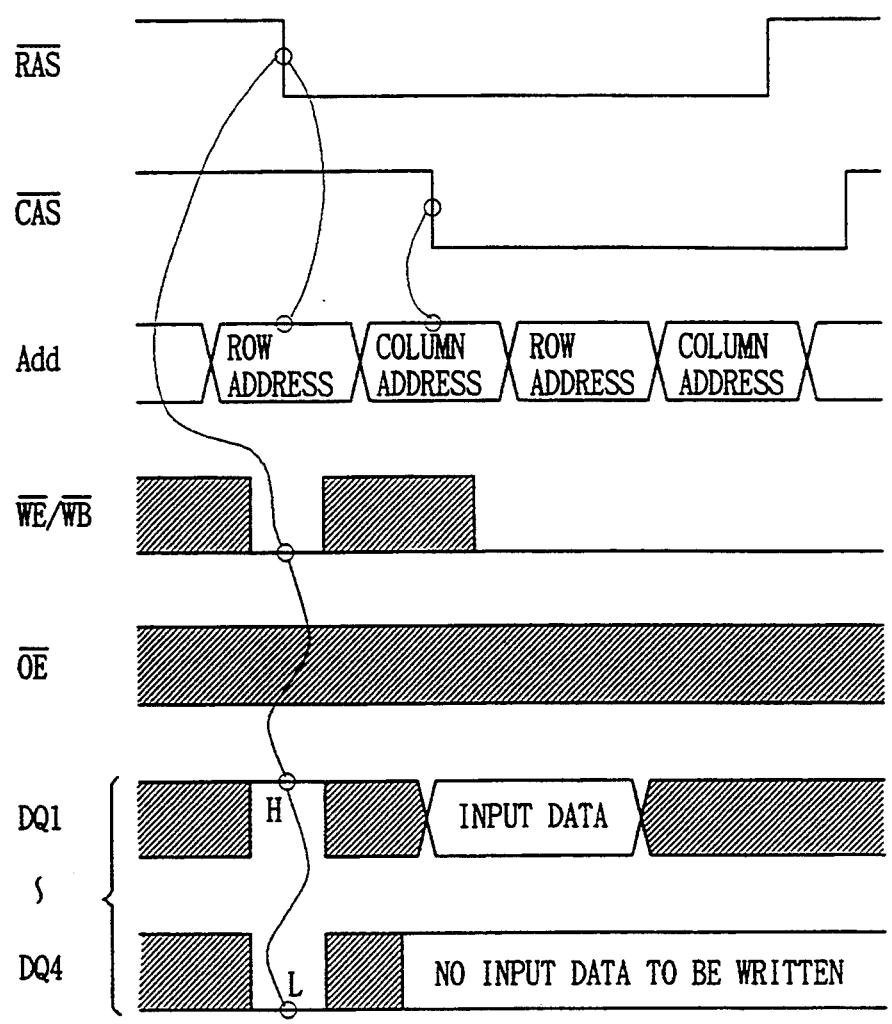
FIG. 8 is a timing chart of a write operation of the DRAM device of FIG. 7.

FIG. 8 is a timing chart of a writing operation of the DRAM device of FIG. 7. With reference to FIG. 8 and FIG. 2, the timing chart of FIG. 8 differs from the timing chart of the reading operation shown in FIG. 2 in that a write control signal $\overline{WE}$ is activated at a fall of a $\overline{CAS}$ signal, thereby designating a write mode.

A writing operation is described in the following. That is, an operation mode designating signal $\overline{WB}$ is strobed at a fall of $\overline{RAS}$ signal. When operation mode designating signal $\overline{WB}$ is at a low level, write control circuit 10' determines that an operation mode is designated. When a bit designating signal applied to data input/output terminals DQ1–DQ4 at that time is at a low level, the circuit inhibits write of input data applied subsequently to the bit designating signal. When the bit designating signal is at a high level, the circuit allows write of input data applied subsequently to the bit designating signal.

Figure 9:
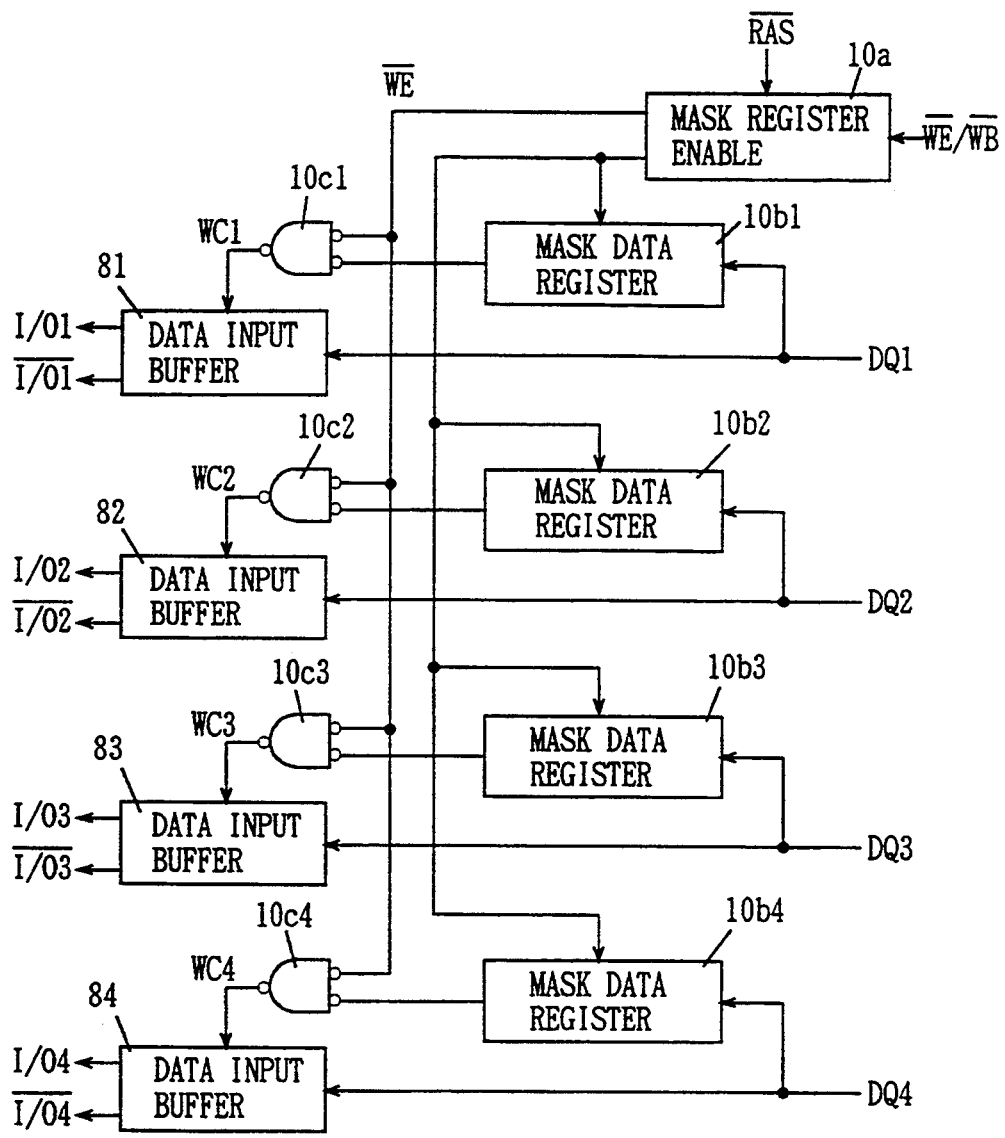
FIG. 9 is a block diagram of a write control circuit and an input buffer of FIG. 7.

FIG. 9 is a block diagram of the write control circuit and the input buffer of FIG. 7. With reference to FIG. 9, write control circuit 10' includes a mask enable signal generation circuit 10$a$, mask registers 10$b$1–10$b$4 and OR gates 10$c$1–10$c$4, similarly to read control circuit 9. Input buffer 8 includes data output buffers 81–84. Mask enable signal generation circuit 10$a$ strobes a $\overline{WB}$ signal at a fall of a $\overline{RAS}$ signal and generates a mask enable signal when $\overline{WB}$ signal is at a low level. Each of mask registers 10$b$1–10$b$4 temporarily holds a bit designating signal applied to the corresponding data input/output terminal DQj in response to the mask enable signal. Each of OR gates 10$c$1–10$c$4 generates a signal WCj for controlling write of each bit in response to internal write enable signal $\overline{WE}$ and a bit designating signal held by the corresponding mask register 7$ba$. When write control signal WCj is at a low level, write to the bit is allowed, while when WCj is at a high level, write to the bit is inhibited.

Figure 10:
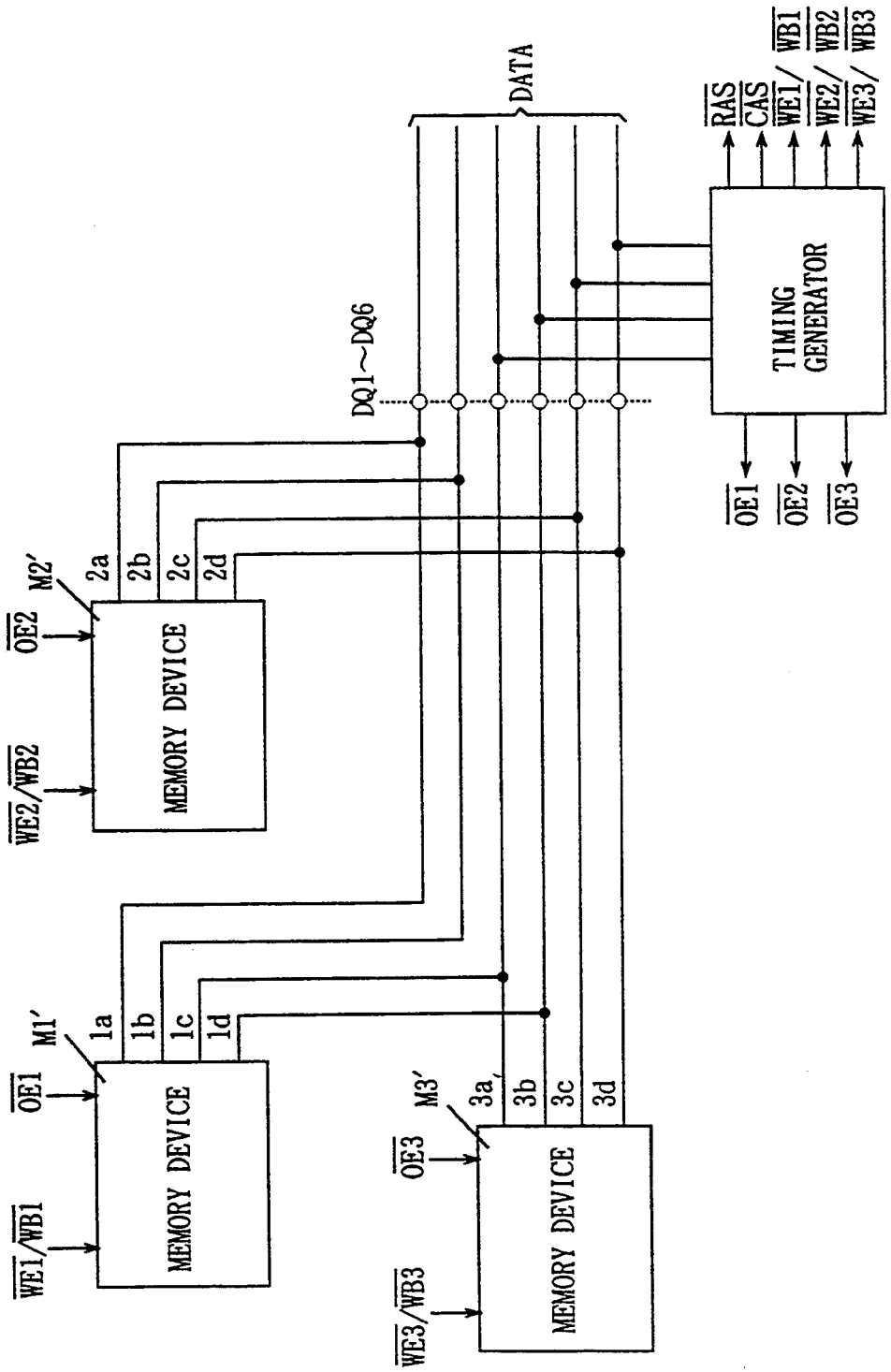
FIG. 10 is a block diagram showing an image data generation device using the DRAM device of FIG. 7.

FIG. 10 is a block diagram showing an image data generation device using the DRAM device shown in FIG. 7. With reference to FIG. 10, the image data generation device differs from that of FIG. 5 in that DRAM devices M1', M2' and M3' are used which allow inhibition of read of/write to a desired bit. The other circuits are similarly structured as those of FIG. 5.

Figure 11:
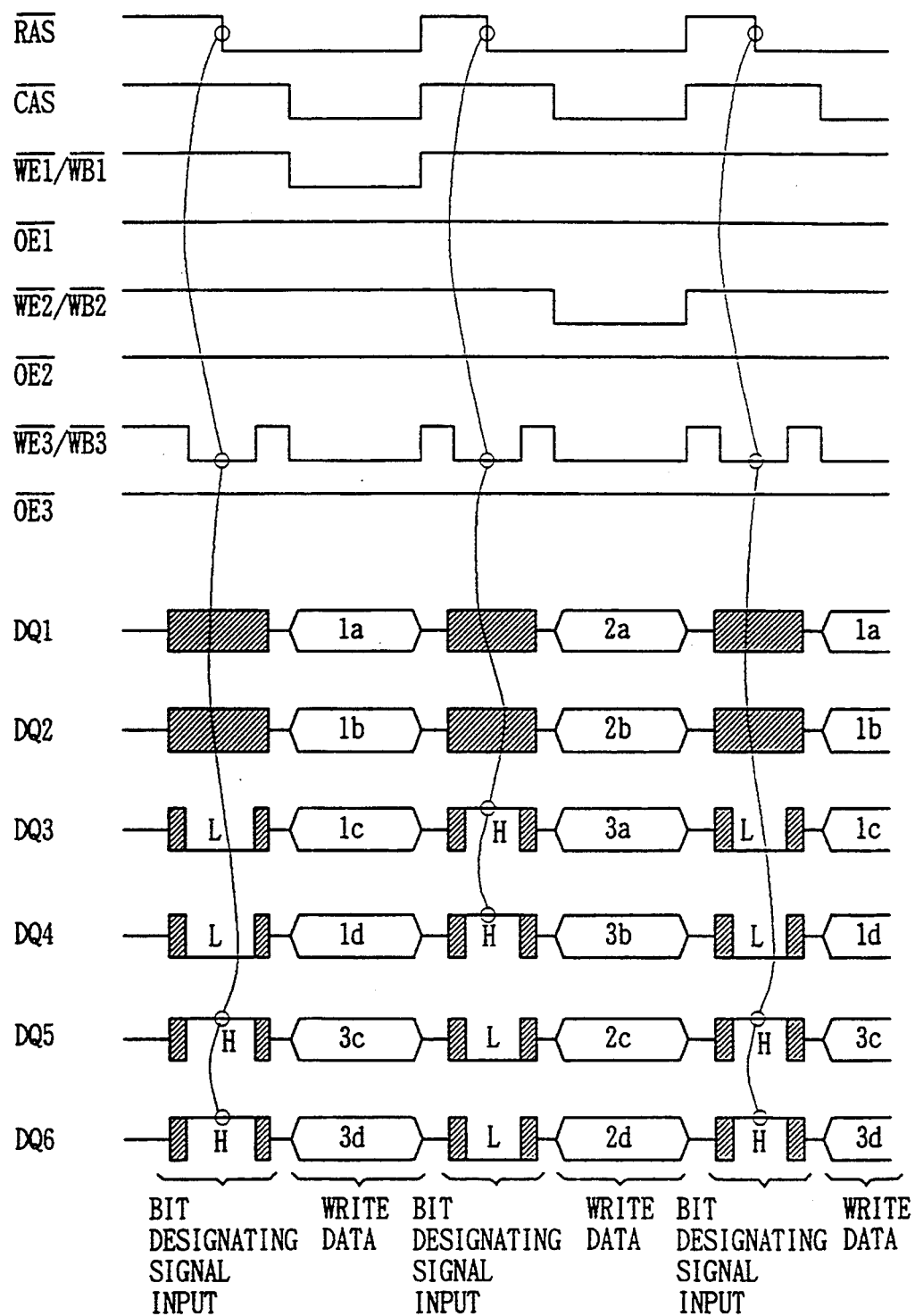
FIG. 11 is a timing chart illustrating a write operation of the image data generation device of FIG. 10.

FIG. 11 is a timing chart illustrating a writing operation of the image data generation device of FIG. 10. The timing chart differs from that of FIG. 6 in that $\overline{OE1}$, $\overline{OE2}$ and $\overline{OE3}$ signals are brought to a high level and they are activated after the rises of write enable signals $\overline{WE1}$–$\overline{WE3}$ signals and $\overline{CAS}$ signal.

Figure 12B:
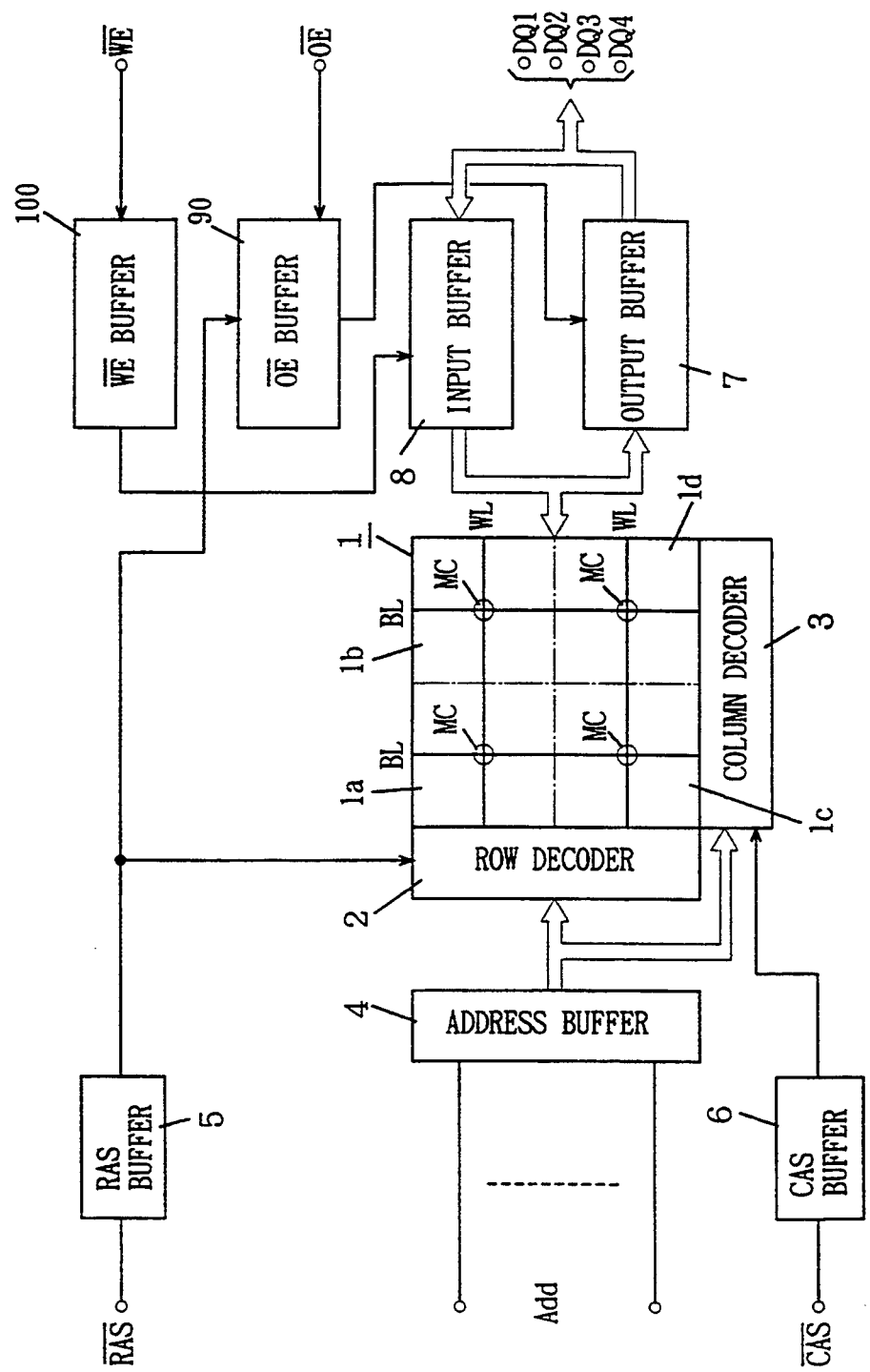
FIG. 12B is a block diagram of a DRAM having a 4-bit configuration.
Figure 12C:
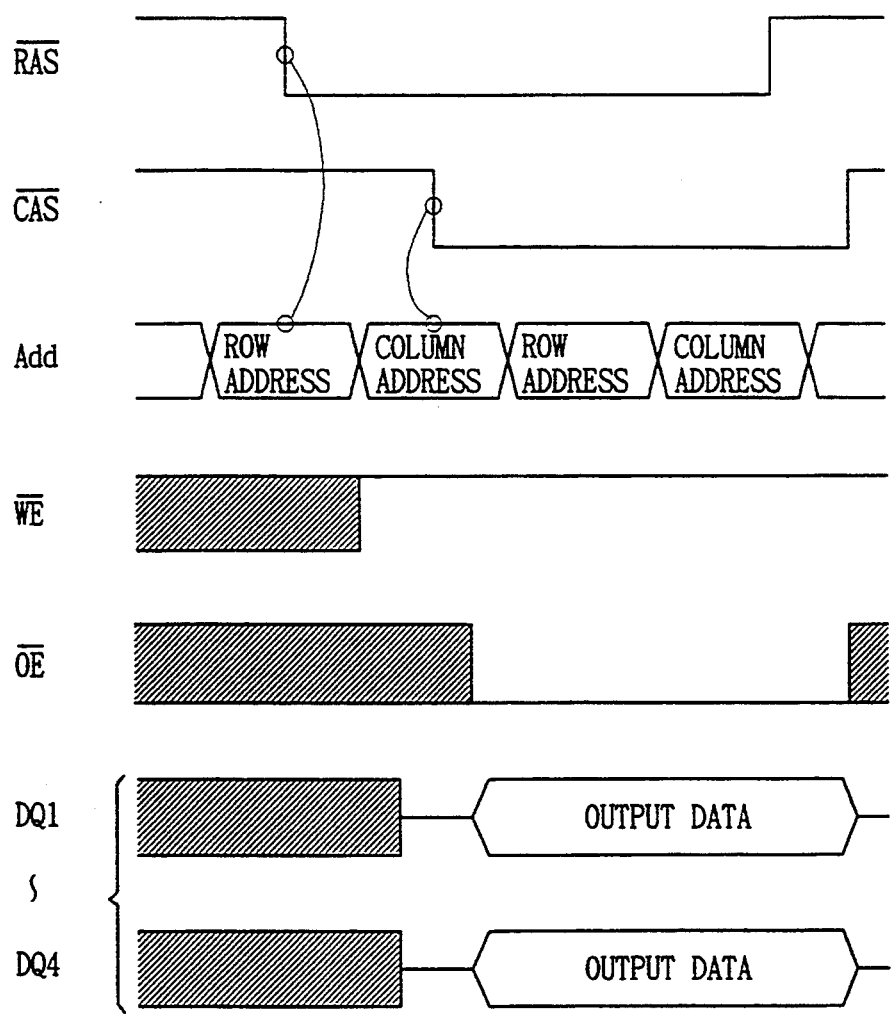
FIG. 12C is a timing chart of the DRAM device of FIG. 12B.
Figure 12D:
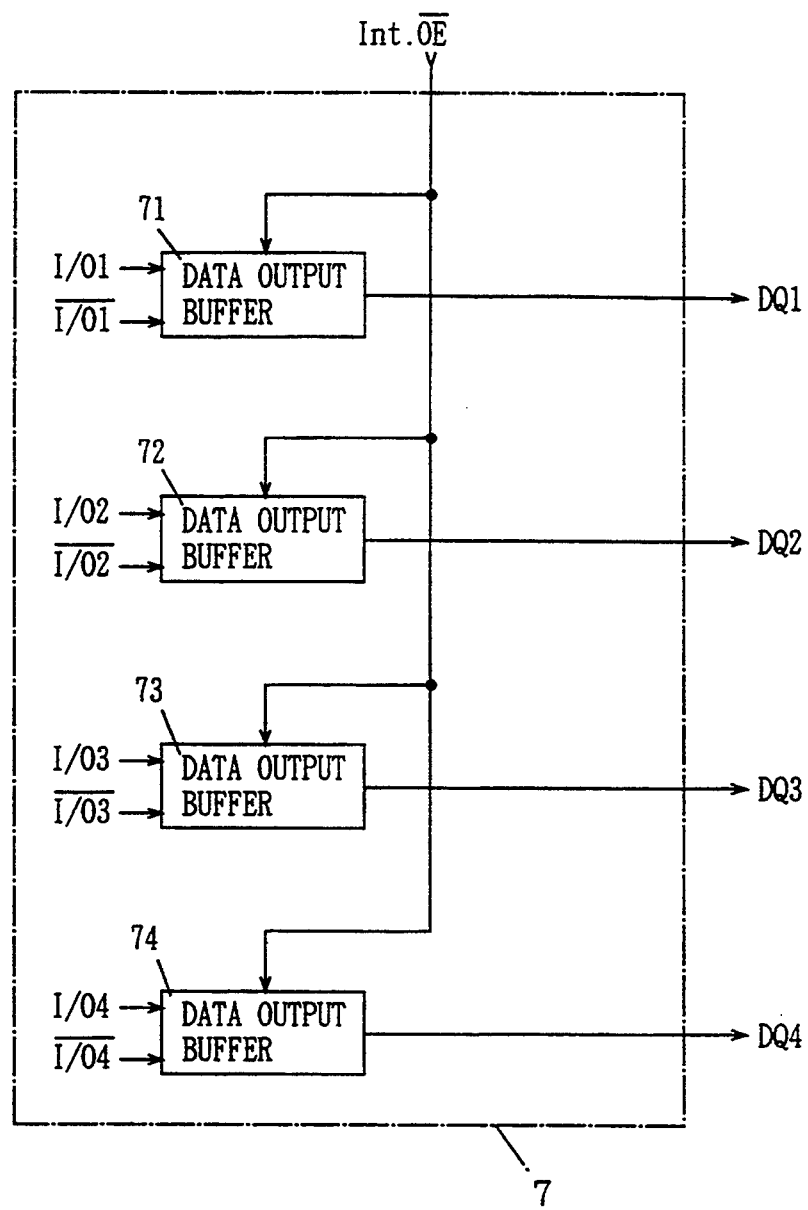
FIG. 12D is a block diagram showing the output buffer of FIG. 12B.

As a result, each memory device is allowed to assume a write state. Each of memory devices M1'–M3' allows data of a desired number of bits to be written in response to operation mode designating signals $\overline{WB1}$–$\overline{WB3}$ and a bit designating signal. The image data generation device shown in FIG. 12 therefore enables a desired number of bits to be read and to be written.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device including a memory cell array having a plurality of memory cells each for storing one-bit data, said semiconductor memory device enabling data to be read on a unit of a plurality of bits comprising:
   a) means for receiving an external address signal;
   b) means for receiving an external row address strobe signal;
   c) means for receiving an external column address strobe signal;
   d) decoder means responsive to said row address strobe signal and said column address strobe signal for decoding said address signal to simultaneously select memory cells of said plurality of bits out of the plurality of memory cells included in said memory cell array;
   e) writing means responsive to an externally generated write control signal for writing externally applied data into said selected memory cells;
   f) means for receiving an external signal for designating an operation mode for inhibiting read of a specific bit out of said plurality of bits;
   g) means responsive to said received operation mode designating signal for receiving an external bit designating signal for designating a bit of which a read operation is to be inhibited out of said plurality of bits and;
   h) read control means for selectively inhibiting read of data of a specified bit responsive to the bit designating signal received by said bit designating signal receiving means and reading a non-inhibited bit of said plurality of bits.

2. The dynamic semiconductor memory device according to claim 1, wherein said operation mode designating signal and said bit designating signal are applied when the externally generated row address strobe signal becomes active.

3. The dynamic semiconductor memory device according to claim 1, wherein said means for receiving said operation mode designating signal includes means responsive to said row address strobe signal for determining whether the operation mode designating signal is present.

4. The dynamic semiconductor memory device according to claim 2, wherein;
   said bit designating signal receiving means includes:
      a plurality of data input/output terminals each provided corresponding to said plurality of bits for receiving said bit designating signal and one-bit data subsequent thereto,
      a plurality of signal holding means each provided corresponding to said plurality of data input/output terminals for holding the bit designating signal from the corresponding one of said data input/output terminals in response to the operation mode designating signal received by said means for receiving an operation mode designating signal, and
   said read controlling means includes:
      a plurality of data output means provided each corresponding to said plurality of data input/output terminals for receiving one-bit data,
      a plurality of control signal generation means operably coupled to said plurality of data outputting means for generating a control signal which inhibits read of a corresponding bit or a control signal which allows read of the corresponding bit and applying the same to the corresponding one of said data outputting means in response to the bit designating signal held by the corresponding one of said signal holding means and to externally generated read control signal.

5. The dynamic semiconductor memory device according to claim 4, wherein said control signal generation means includes logical operation means for performing a logical operation of the bit designating signal held by said corresponding signal holding means and said read control signal and applying the logical operation result to the corresponding one of said data outputting means.

6. The dynamic semiconductor memory device according to claim 4, wherein each of said data outputting means assumes a high impedance state in response to the control signal for inhibiting read generated by the corresponding one of said control signal generation means and applies the corresponding one-bit data to the input/output terminal in response to the control signal for allowing read.

7. A dynamic semiconductor memory device including a memory cell array having a plurality of memory cells each for storing one-bit data, said semiconductor memory device enabling data to be read/written on a unit of a plurality of bits comprising:
   a) means for receiving an external address signal;
   b) means for receiving an external row address strobe signal;
   c) means for receiving an external column address strobe signal;
   d) decoder means responsive to said row address strobe signal and said column address strobe signal for decoding said address signal to simultaneously select memory cells of said plurality of bits out of the plurality of memory cells included in said memory cell array;
   e) means for receiving an external signal for designating an operation mode for inhibiting read/write to a specified bit out of said plurality of bits;
   f) means responsive to said received operation mode designating signal for receiving an external bit designating signal for designating a bit of which a read/write operation is to be inhibited out of said plurality of bits;
   g) read control means for selectively inhibiting read of the specified bit responsive to the bit designating signal received by said bit designating signal receiving means, and reading a non-inhibited read bit; and
   h) write control means for selectively inhibiting write to said specified bit based on an externally generated write control signal and the bit designating signal received by said bit designating signal receiving means and writing in a non-inhibited write bit.

8. A device for generating data which is an arbitrary number of bits in length, comprising:
   a) a memory device from which data comprising a predetermined number of bits can be read out;
   b) a memory cell array storing units of data in an n bit format, where n is an integer specifying the bit length of each unit of data stored in said memory cell array;
   c) means for reading an n bit unit of data stored in addressed cells within said memory cell array;
   d) access control means, responsive to a signal identifying at least one bit, for selectively inhibiting output of said at least one bit from the data read from said memory cell array, wherein said signal identifying at least one bit is based on at least a condition of said at least one bit prior to application of said signal identifying said at least one bit; and e) means for combining the predetermined number of bits read from said memory device with the uninhibited bits read from said memory cell array to produce output data of said arbitrary number of bits in length.

9. A device as in claim 8, wherein said memory device comprises:

a) a second memory cell array storing units of data in an n bit format, where n is an integer specifying the bit length of each unit of data stored in said second memory cell array;

b) second means for reading an n bit of data stored in addressed cells within said second memory cell array; and c) second access control means, responsive to a signal identifying at least one bit, for selectively inhibiting output of said at least one bit from the data read from the second memory cell array, wherein said signal identifying at least one bit is based on at least a condition of said at least one bit prior to application of said signal identifying said at least one bit.

10. A method of accessing data comprising the steps of:

a) reading an n bit unit of data stored in addressed cells within a memory cell array which stores units of data in an n bit format, where n is an integer specifying the bit length of each unit of data stored in said memory cell array;

b) selectively inhibiting output of at least one bit from the n bits of data read from the memory cell array in response to a signal identifying said at least one bit, wherein said signal identifying at least one bit is based on at least a condition of said at least one bit prior to application of said signal identifying said at least one bit; and c) combining the uninhibited bits read from said memory cell array with a predetermined number of bits read out of another memory device to produce output data of an arbitrary number of bits in length.

11. An image data generation device for generating image data of an arbitrary number of bits, comprising:

a) a plurality of dynamic semiconductor memory devices each enabling data to be read/written on a basis of a plurality of bits; and b) means for generating a signal for enabling each of said dynamic semiconductor memory devices to operate in a write state, a signal for enabling the same to operate in a read state, a signal for designating an operation mode for inhibiting read of a specified bit out of said plurality of bits and a signal for designating a bit read of which is to be inhibited out of said plurality of bits, wherein each of said dynamic semiconductor memory devices comprises i) means for receiving the operation mode designating signal generated by said signal generation means;

ii) means responsive to the received operation mode designating signal for receiving the signal for designating the bit of which a read operation is to be inhibited and being generated by said signal generation means; and iii) read control means, responsive to the signal for causing a read state generated by said signal generation means and the received signal for designating the bit of which the read operation is to be inhibited, for inhibiting read of said specified bit.

12. An image data generation device for generating image data of an arbitrary number of bits, comprising:

a) a plurality of dynamic semiconductor memory devices each enabling data to be read/written on a unit of a plurality of bits; and b) means for generating a signal for enabling each of said dynamic semiconductor devices to operate in a write state, a signal for enabling the same to operate in a read state, a signal for designating an operation mode for inhibiting read of/write to a specified bit out of said plurality of bits and a signal for designating a bit read of which is to be inhibited out of said plurality of bits, wherein each of said dynamic semiconductor memory devices comprises i) means for receiving the operation mode designating signal generated by said signal generation means, ii) means responsive to the received operation mode designating signal for receiving the signal for designating a bit of which a read operation is to be inhibited and being generated by said signal generation means, iii) read control means, responsive to the signal for causing a read state generated by said signal generation means and said received signal for designating the bit of which the read operation is to be inhibited, for inhibiting read of said specified bit, and iv) write control means, responsive to the signal for causing a write state generated by said signal generation means and said received signal for designating a bit to which a write operation is to be inhibited, for inhibiting write to said specified bit.

13. A method of operating a dynamic semiconductor memory device including a memory cell array having a plurality of memory cells each for storing one-bit data, said method comprising the steps of:

a) receiving an external address signal;

b) receiving an external row address strobe signal;

c) receiving an external column address strobe signal;

d) decoding said address to simultaneously select memory cells the plurality of memory cells included in said memory cell array;

e) writing externally applied data of a plurality of bits into said selected memory cells;

f) externally receiving a signal for designating an operation mode for inhibiting read of a specified bit out of said plurality of bits;

g) externally receiving a bit designating signal for designating a bit of which a read operation is to be inhibited out of said plurality of bits n response to said received operation mode designating signal; and h) selectively inhibiting read of said specified bit based on said externally generated read control signal and the bit designating signal received by said bit designating signal and reading a non-inhibited bit of said plurality of bits.

* * * * *